US010353138B2

(12) United States Patent
Park et al.

(10) Patent No.: US 10,353,138 B2
(45) Date of Patent: Jul. 16, 2019

(54) DISPLAY DEVICE AND METHOD FOR FABRICATING THE SAME

(71) Applicant: SAMSUNG DISPLAY CO., LTD., Yongin, Gyeonggi-Do (KR)

(72) Inventors: Sung Dong Park, Asan-si (KR); Hyeok Tae Kwon, Yongin-si (KR); Sang Hwan Lee, Asan-si (KR); Ki Seok Cha, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/731,333

(22) Filed: Jun. 4, 2015

(65) Prior Publication Data
US 2016/0057872 A1 Feb. 25, 2016

(30) Foreign Application Priority Data

Aug. 19, 2014 (KR) .................. 10-2014-0107731

(51) Int. Cl.
F21V 8/00 (2006.01)
H04N 5/64 (2006.01)
H05K 1/02 (2006.01)
H05K 1/18 (2006.01)
H05K 3/00 (2006.01)
(Continued)

(52) U.S. Cl.
CPC ....... G02B 6/0083 (2013.01); G02F 1/13452 (2013.01); H05K 1/0278 (2013.01); G02B 6/0086 (2013.01); H04N 5/64 (2013.01); H05K 1/189 (2013.01); H05K 3/0058 (2013.01); H05K 3/361 (2013.01); H05K 3/4691 (2013.01); H05K 2201/0909 (2013.01); H05K 2201/10136 (2013.01); H05K 2203/0228 (2013.01); H05K 2203/107 (2013.01)

(58) Field of Classification Search
CPC .. G02B 6/0038; G02B 6/0055; G02B 6/0021; G02B 6/0083; G02B 6/0068; G02B 6/0088; G02F 1/133615; G02F 1/133608; G02F 1/133604
USPC .................................. 362/611, 631, 632, 633
See application file for complete search history.

(56) References Cited

U.S. PATENT DOCUMENTS 5,510,918 A * 4/1996 Matsunaga ......... G02F 1/13458
349/149
5,731,796 A * 3/1998 Furuhashi ............ G09G 3/2011
345/87

(Continued)

FOREIGN PATENT DOCUMENTS

KR 2002-0010313 A 2/2002
KR 10-2004-0100756 A 12/2004
KR 10-2012-0052764 A 5/2012

Primary Examiner — Tsion Tumebo
(74) Attorney, Agent, or Firm — Lewis Roca Rothgerber Christie LLP

(57) ABSTRACT

A display device may include a display panel having a curved shape, a first printed circuit board and a second printed circuit board, at least one first carrier tape configured to connect the first printed circuit board to the display panel, at least one second carrier tape configured to connect the second printed circuit board to the display panel, and a connection unit configured to connect the first and second printed circuit boards to each other. A part of a layer of the connection unit may be a portion of a layer included in at least one of the first and second printed circuit boards.

10 Claims, 7 Drawing Sheets

(51) Int. Cl.
    *H05K 3/36*     (2006.01)
    *H05K 3/46*     (2006.01)
    *G02F 1/1345*     (2006.01)

(56) References Cited

U.S. PATENT DOCUMENTS

| | | | | |
|---|---|---|---|---|
| 6,288,343 | B1* | 9/2001 | Ahn | H05K 3/4691 |
| | | | | 174/254 |
| 7,753,539 | B2* | 7/2010 | Jung | F21V 19/009 |
| | | | | 362/23.18 |
| 7,847,912 | B2* | 12/2010 | Nishizawa | G02F 1/133305 |
| | | | | 349/158 |
| 8,188,372 | B2* | 5/2012 | Sato | H05K 3/4691 |
| | | | | 174/254 |
| 8,297,788 | B2* | 10/2012 | Bishop | H05K 1/142 |
| | | | | 362/219 |
| 8,547,500 | B2* | 10/2013 | Kang | G02B 6/0088 |
| | | | | 349/58 |
| 8,721,150 | B2* | 5/2014 | Kim | G02F 1/133603 |
| | | | | 362/611 |
| 8,757,861 | B2* | 6/2014 | Kim | H04M 1/0266 |
| | | | | 362/632 |
| 8,998,442 | B2* | 4/2015 | Ueyama | G02B 6/0083 |
| | | | | 362/219 |
| 9,597,607 | B2* | 3/2017 | Bdeir | H01R 13/6205 |

* cited by examiner

DISPLAY DEVICE AND METHOD FOR FABRICATING THE SAME

CROSS-REFERENCE TO RELATED APPLICATION

This application claims priority to and the benefit of Korean Patent Application No. 10-2014-0107731, filed on Aug. 19, 2014, the content of which is incorporated herein in its entirety by reference.

BACKGROUND

1. Field

One or more exemplary embodiments of the invention relate to a display device capable of reducing or effectively preventing damage to a carrier tape, and to a method of manufacturing the same.

2. Description of the Related Art

A liquid crystal display ("LCD") is a kind of flat panel display ("FPD"), which is most widely used as a display device. The LCD includes two substrates on which an electric field generating electrode such as a pixel electrode and a common electrode is disposed, and a liquid crystal layer interposed between the two substrates. In the LCD, a voltage is applied to the electric field generating electrode so that liquid crystal molecules of the liquid crystal layer are rearranged, thereby adjusting the amount of transmitted light.

LCDs are used as a display device in a wide range of applications including televisions and also are available in a wide range of screen sizes. Depending on positions at which a viewer sees a central portion of a screen or left and right end portions thereof, a visual disparity becomes disadvantageously large as the screen size of LCDs is increased.

In order to compensate for the visual disparity, a curved surface display device has been developed, of which a surface is curved in a partial-circle profile extending from a central portion of a display area to each of opposing sides of the central portion.

The curved surface display device includes a curved display panel and a bottom chassis. In this case, a plurality of carrier tapes are disposed between the display panel and a printed circuit board ("PCB") so as to electrically connect the display panel to the PCB.

When the display device is completed, the PCB rotates about carrier tapes serving as an axis such as to be disposed on the back (rear) of the bottom chassis.

Before the PCB rotates to be disposed on the back of the bottom chassis, curvature of the PCB is substantially identical to that of the display panel. However, after the PCB rotates and is disposed on the back of the bottom chassis, the curvature of the PCB becomes higher. Due to the higher curvature, tensile force is applied to the PCB from two sides thereof. Stress is continuously imposed on the PCB with the application of the tensile force. Further, the stress affects the carrier tapes connected to the PCB. In other words, the carrier tapes that include relatively weak (tender) and flexible material can be torn by the stress. Accordingly, wire patterns and driver integrated circuits, which are disposed on the tape carriers, are likely to be damaged and to function poorly.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY

Aspects of one or more exemplary embodiments of the invention are directed toward a display device that is capable of reducing or effectively preventing damage to carrier tapes, and toward a method of manufacturing the display device.

According to an exemplary embodiment of the invention, a display device includes a display panel having a curved shape, a first printed circuit board and a second printed circuit board, at least one first carrier tape configured to connect the first printed circuit board to the display panel, at least one second carrier tape configured to connect the second printed circuit board to the display panel, and a connection unit configured to connect the first and second printed circuit boards to each other. At least a part of the connection unit may be a portion of a layer included in at least one of the first and second printed circuit boards.

A length of a part of the connection unit extending from the first printed circuit board to the second printed circuit board may be longer than a distance between the first and second printed circuit boards.

At least a part of the first printed circuit board may protrude towards the second printed circuit board.

At least a part of the second printed circuit board may protrude towards the first printed circuit board.

At least one of the first and second printed circuit boards may include a polyimide layer, a first upper conductive layer on the polyimide layer, an upper coverlay layer on the first upper conductive layer, an upper prepreg layer on the upper coverlay layer, a second upper conductive layer on the upper prepreg layer, a first resist layer on the second upper conductive layer, a first lower conductive layer under the polyimide layer, a lower coverlay layer under the first lower conductive layer, a lower prepreg layer under the lower coverlay layer, a second lower conductive layer under the lower prepreg layer, and a second resist layer under the second lower conductive layer.

The connection unit may include the polyimide layer, the first upper conductive layer, the upper coverlay layer, the first lower conductive layer, the lower coverlay layer.

The display device may further include a bottom chassis, a light source unit configured to emit light, a light guide plate configured to provide the display panel with light from the light source unit, and a mold frame configured to support the display panel while being fixed to the bottom chassis.

The first and second printed circuit boards may be disposed on a rear of the bottom chassis.

According to an exemplary embodiment of the invention, in a method for manufacturing a display device including: a display panel having a curved shape; a first printed circuit board and a second printed circuit board; at least one first carrier tape configured to connect the first printed circuit board to the display panel; at least one second carrier tape configured to connect the second printed circuit board to the display panel; and a connection unit configured to connect the first and second printed circuit boards to each other, wherein at least a part of the connection unit is a portion of a layer included in at least one of the first and second printed circuit boards, and wherein at least a part of the first printed circuit board is coupled to at least a part of the second printed circuit board, the method includes: preparing a bottom chassis having a curved shape; assembling the bottom chassis and the display panel; separating the first printed circuit board from the second printed circuit board; and rotating the first and second printed circuit boards to a rear of the bottom chassis.

The method may further include arranging a reflector, a light guide plate, an optical sheet, a mold frame, and a light source unit on the bottom chassis.

The separating of the first printed circuit board from the second printed circuit board may include preparing a laser cutting apparatus and cutting the connection unit between the first and second printed circuit boards utilizing the laser cutting apparatus.

A cutting line may be marked on the connection unit between the first and second printed circuit boards.

The separating of the first printed circuit board from the second printed circuit board may include preparing a laser cutting apparatus and cutting the connection unit between the first and second printed circuit boards along the cutting line utilizing the laser cutting apparatus.

A distance between the first and second printed circuit boards may be shorter than a length of a portion of the connection unit extending from the first printed circuit board to the second printed circuit board.

According to an exemplary embodiment of the invention, in a system for manufacturing a display device including: a display panel having a curved shape; a first printed circuit board and a second printed circuit board; at least one first carrier tape configured to connect the first printed circuit board to the display panel; at least one second carrier tape configured to connect the second printed circuit board to the display panel; and a connection unit configured to connect the first and second printed circuit boards to each other, wherein at least a part of the connection unit is a portion of a layer included in at least one of the first and second printed circuit boards, and wherein at least a part of the first printed circuit board is coupled to at least a part of the second printed circuit board, the system includes: means for preparing a bottom chassis having a curved shape; means for assembling the bottom chassis and the display panel; means for separating the first printed circuit board from the second printed circuit board; and means for rotating the first and second printed circuit boards to a rear of the bottom chassis.

According to one or more exemplary embodiments of the invention, a first printed circuit board and a second printed circuit board move from side to side, thereby decreasing or minimizing stress concentration on the first and second printed circuit boards. Thus, deformation of a first carrier tape and a second carrier tape and damage thereto may also be reduced or effectively prevented.

The foregoing summary is illustrative only and is not intended to be in any way limiting the claims of the invention. In addition to the illustrative embodiments and features described above, further embodiments and features will become apparent by reference to the drawings and the following detailed description.

BRIEF DESCRIPTION OF THE DRAWINGS

The above and other features of the invention will be more clearly understood from the following detailed description taken in conjunction with the accompanying drawings, in which.

DETAILED DESCRIPTION

Figure 1:
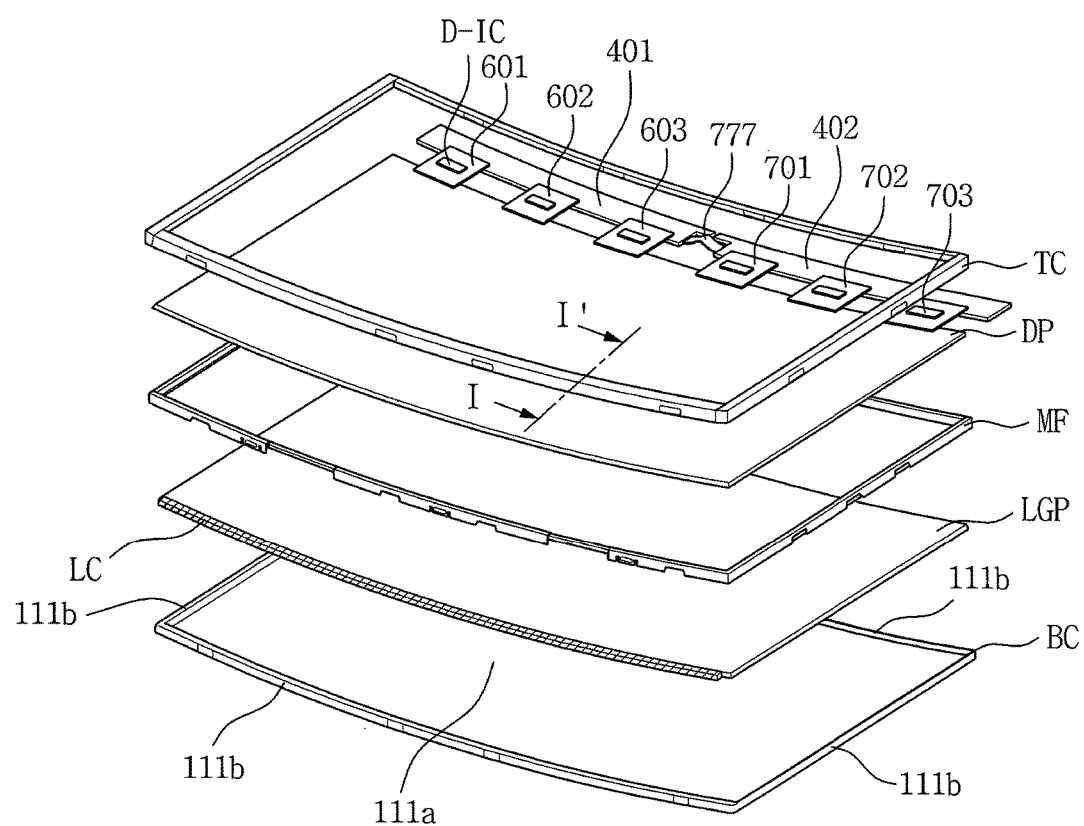
FIG. 1 is an exploded perspective view illustrating an exemplary embodiment of a display device according to the invention.

Advantages and features of the invention and methods for achieving them will be made clear from exemplary embodiments described below in more detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims, and equivalents thereof. Therefore, well-known constituent elements, operations and techniques are not described in detail in the exemplary embodiments in order to prevent the invention from being obscurely interpreted. Like reference numerals refer to like elements throughout the specification.

The spatially relative terms "lower," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "lower" another device may be placed "upper" another device. Accordingly, the illustrative term "lower" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. As used herein, the terms "use," "using," and "used" may be considered synonymous with the terms "utilize," "utilizing," and "utilized," respectively.

Further, the use of "may" when describing embodiments of the inventive concept refers to "one or more embodiments of the present invention". Also, the term "exemplary" is intended to refer to an example or illustration.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a display device according to the invention will be fully described with reference to FIGS. 1 to 3. The names of elements used in the description hereinafter may be selected in consideration of ease of description of a specification and may be different from the names of the components of the actual product.

FIG. 1 is an exploded perspective view illustrating an exemplary embodiment of a display device according to the invention. FIG. 2 is a cross-sectional view taken along line I-I' of FIG. 1.

According to one or more exemplary embodiment, a display device is a curved display device of which a surface thereof is curved in a partial-circle profile extending from a central portion of a display area to opposing sides thereof. Hereinafter, unless otherwise stated, all components may include materials having bendability.

Figure 2:
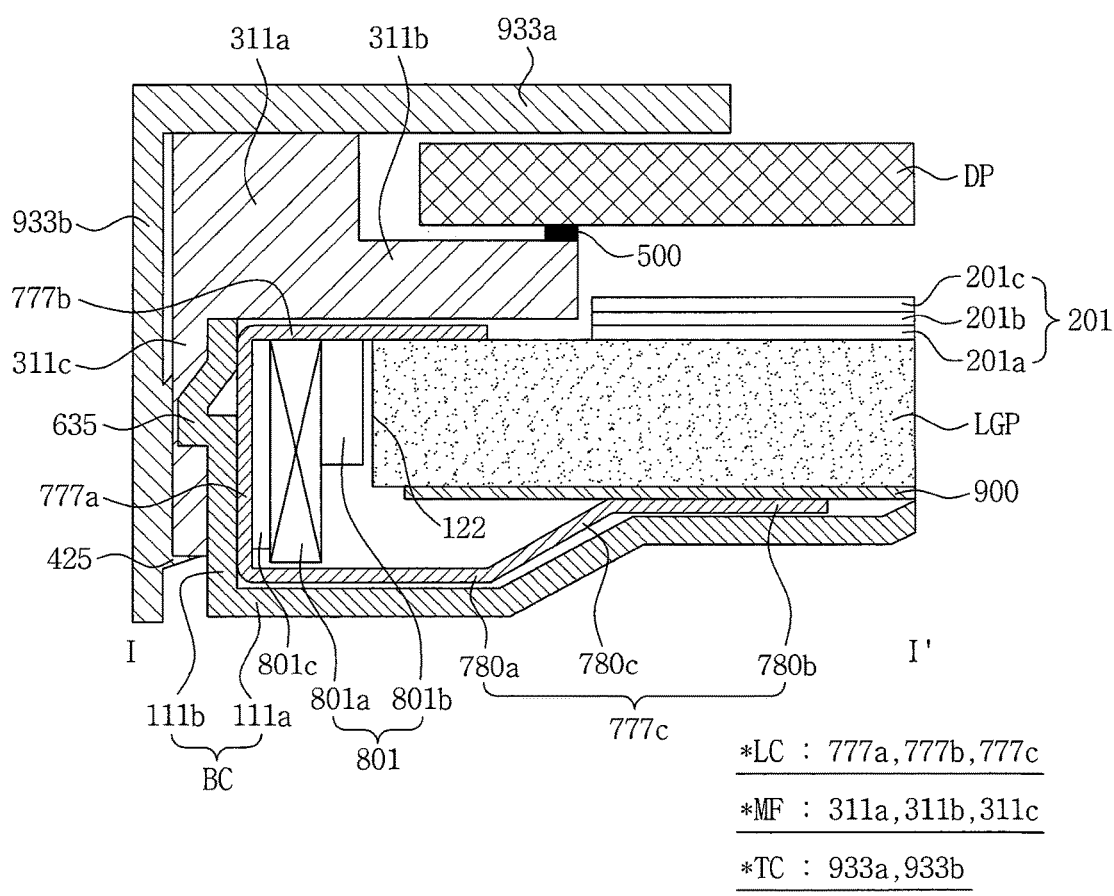
FIG. 2 is a cross-sectional view taken along line I-I' of FIG. 1.

The curved surface display device may include a bottom chassis BC, a reflector 900, a light guide plate LGP, an optical sheet 201, a light source unit 801, a light source cover LC, a mold frame MF, a display panel DP and a top chassis TC as illustrated in FIGS. 1 and 2. The above enumerated components may be curved in a shape or profile to fit the overall curved surface of the display device. The reflector 900, light guide plate LGP, optical sheet 201, light source unit 801, light source cover LC and mold frame MF may collectively be included in a backlight unit according to one exemplary embodiment, but the invention is not limited thereto. The display panel DP and the backlight unit may be assembled into a collective laminated structure so as to form a display module. The display module may further include the top chassis TC and the bottom chassis BC that are configured to protect and fix the display panel DP and the backlight unit. The display module may also include a driver circuit board (not shown) configured to drive the display panel DP.

The bottom chassis BC may include an accommodating space defined therein. The reflector 900, light guide plate LGP, optical sheet 201, light source unit 801 and light source cover LC may be disposed in the accommodating space. In order to define the accommodating space, the bottom chassis BC may include a base portion 111*a* and a plurality of side portions 111*b*. In an exemplary embodiment, the base portion 111*a* may have a quadrangular shape in the top plan view and each of the plurality of side portions 111*b* may extend (or protrude) from respective edge portions of the base portion 111*a* to a set or predetermined height in the thickness direction. Edge (or end) portions of adjacent side portions 111*b* may be coupled to each other. A space surrounded by the side portions 111*b* and the base portion 111*a* may define the accommodating space of the bottom chassis BC. Meanwhile, a locking projection 635 may be disposed on an outside of the side portions 111*b* opposing each other with respect to the base portion 111*a*, and the mold frame MF may be fixed to the bottom chassis BC by the locking projection 635. The locking projection 635 may be defined by a bent portion of the corresponding side portion 111*b* which protrudes outwardly toward the mold frame MF.

The light source unit 801 may be configured to produce light. As illustrated in FIG. 2, the light source unit 801 may include a printed circuit board ("PCB") 801*a* and at least one light source 801*b*. The PCB 801*a* may be curved to have a partial-circle shape.

Although not illustrated, a surface of the PCB 801*a* may be partitioned into at least one mounting area and a conductive line area. Where the light source unit 801 includes at least two light sources, the mounting area may be provided in plural such that one light source is disposed in each mounting area, and a plurality of conductive lines may be disposed in the conductive line area so as to transmit drive power to the light sources. A power for driving the light sources may be generated in an external power supply unit and may be then supplied to the plurality of conductive lines through a separate connector.

The light source 801*b* may be configured to emit light outwards therefrom and may be disposed on the PCB 801*a*. The light source 801*b* may be a light-emitting diode ("LED") package that includes an LED. In an exemplary embodiment, for instance, one LED package may include a red LED generating and emitting red light, a green LED generating and emitting green light, and a blue LED generating and emitting blue light. The LED package may produce white light by combining (or mixing) three colors. In another exemplary embodiment, the LED package may include only the blue LED among the LEDs of the three colors and a phosphor may be disposed in a light emitting unit of the blue LED so as to convert the generated blue light to white light. Light emitted from the light source 801*b* may be incident on the light guide plate LGP.

As illustrated in FIGS. 1 and 2, the light guide plate LGP may have a shape of polyhedron having curved surfaces. Among a plurality of surfaces of the light guide plate LGP, one surface facing the light source may be set as a light incident (side) surface 122. The light incident surface 122 may have a curved shape in the cross-sectional thickness direction. Where a long side of the display panel DP is curved, the long side may be placed corresponding to the light incident surface 122 of the light guide plate LGP. Light emitted from the light source 801b may be incident on the light incident surface 122 of the light guide plate LGP, and then, the light may propagate inside the light guide plate LGP. The light guide plate LGP may guide the light to a display area of the display panel DP using total internal reflection. The guided light may exit through a light-emitting surface at an upper portion of the light guide plate LGP. In one embodiment, a plurality of scattering patterns may be further disposed on a lower outside surface of the light guide plate LGP opposite to the light-emitting surface so as to increase reflectivity of the light guide plate LGP. The distance between the scattering patterns may become larger as the scattering patterns are disposed farther from the light incident surface 122 of the light guide plate LGP in the top plan view.

The light guide plate LGP may include a light-transmissive material, e.g., an acrylic resin such as polymethylmethacrylate ("PMMA") or polycarbonate ("PC"), so as to guide light efficiently.

The reflector 900 may be disposed under the light guide plate LGP. The reflector 900 may reflect light passing through the lower outside surface of the light guide plate LGP and emitted outwards back into the light guide plate LGP, thereby reducing (or minimizing) light loss.

The optical sheet 201 may diffuse and collimate light received from the light guide plate LGP. As illustrated in FIGS. 1 and 2, the optical sheet 201 may be disposed between the light guide plate LGP and the display panel DP. The optical sheet 201 may include a diffusion sheet 201a, a prism sheet 201b and a protective sheet 201c, but the invention is not limited thereto. The diffusion sheet 201a, prism sheet 201b and protective sheet 201c may be sequentially disposed such as to be laminated on the light guide plate LGP in the order in which they are enumerated.

The diffusion sheet 201a may diffuse light received from the light guide plate LGP so as to prevent or protect the light from being partially concentrated.

The prism sheet 201b may be disposed on the diffusion sheet 201a so as to collimate light diffused from the diffusion sheet 201a in a direction perpendicular or normal to the display panel DP. For this purpose, the prism sheet 201b may have triangular prisms on one surface thereof in a set or predetermined arrangement.

The protective sheet 201c may be disposed on the prism sheet 201b so as to protect a surface of the prism sheet 201b and diffuse light to obtain uniformly distributed light. The light passing through the protective sheet 201c may be provided to the display panel DP.

As illustrated in FIG. 2, the light source cover LC may surround one side of the light guide plate LGP so as to include the light source unit 801 and the light incident surface 122 in an accommodating space thereof. The light source cover LC may arrange (e.g., align) the light incident surface 122 and the light sources 801b so that light emitted from the light sources 801b may be incident accurately on the light incident surface 122 of the light guide plate LGP. Consequently, the light source cover LC may also have a curved shape. Where the light guide plate LGP includes a flexible material that does not maintain a specific shape, e.g., curved or bent shape, alone (by itself), the light source cover LC may apply a force to the light guide plate LGP to allow the light guide plate LGP to maintain a curved shape.

The light source cover LC may include a metal material such as stainless steel.

The light source cover LC may include a light source installation part 777a, an upper cover 777b, and a lower cover 777c.

The upper cover 777b may extend from one edge portion of the light source installation part 777a to an upper outside surface of the light guide plate LGP.

The lower cover 777c may extend from an opposing edge portion of the light source installation part 777a to a lower outside surface of the light guide plate LGP. The lower cover 777c may have a variety of planar shapes according to the top plan view shape of the base portion 111a of the bottom chassis BC. In an exemplary embodiment, as illustrated in FIG. 2, the lower cover 777c may include a first horizontal part 780a extending from the opposing side of the light source installation part 777a to a set or predetermined length, a second horizontal part 780b disposed nearer a lower surface of the light guide plate LGP than the first horizontal part 780a, and an inclined part 780c configured to connect the first and second horizontal parts 780a and 780b to each other.

The light sources 801b and the PCB 801a may be disposed in an accommodating space surrounded by the light source installation part 777a, upper cover 777b and lower cover 777c. An adhesive member 801c may be disposed on any surface among surfaces of the light source installation part 777a which faces a respective surface of the PCB 801a. The light source unit 801 may be bonded to the light source installation part 777a by the adhesive member 801c. The adhesive member 801c may be a double-sided tape, and the light source unit 801 may be configured to include one adhesive side of the double-sided tape bonded to the PCB 801a.

The mold frame MF may support the display panel DP and the top chassis TC while being fixed to the bottom chassis BC and also may maintain a constant space between the display panel DP and the optical sheet 201. To perform the above functions, the mold frame MF may be shaped like a quadrangular frame that includes a first support part 311a, a second support part 311b and a fixing part 311c.

The first support part 311a may support a top chassis TC portion that covers (e.g., overlaps) the first support part 311a while being placed on the plurality of side portions 111b.

The second support part 311b may extend from an inner edge portion of the first support part 311a toward the optical sheet 201. The second support part 311b may be lower in cross-sectional height than the first support part 311a with respect to a common reference point (e.g., smaller in thickness). There may be a space between the top chassis TC and the second support part 311b because of the height difference between the first and second support parts 311a and 311b, and an edge portion of the display panel DP may be disposed in the space. A cushion pad 500 may be disposed on an end portion of the second support part 311b, and the cushion pad 500 may protrude from the end portion towards the display panel DP. The edge portion of the display panel DP may be placed on the cushion pad 500. The cushion pad 500 may reduce or effectively prevent direct contact between the display panel DP and the second support part 311b, thereby reducing scratches on the display panel DP.

The fixing part 311c may extend from a lower side of the first support part 311a toward the side portions 111b. A coupling groove may be defined extending from an inner surface of the fixing part 311c, namely a surface facing the locking projection 635, among surfaces of the fixing part 311c. The locking projection 635 may be fitted into the coupling groove so that the mold frame MF may be fixed to the bottom chassis BC.

The top chassis TC may be shaped like a quadrangular frame so that a central portion of the top chassis TC is open. The top chassis TC may be disposed on the display panel DP. A display area A1 of the display panel DP may be exposed through the open part of the top chassis TC. The top chassis TC may surround an edge portion of the display panel DP, an upper surface and a side surface of the first support part 311a of the mold frame MF, and a side surface of the fixing part 311c of the mold frame MF. To perform the above function, the top chassis TC may include a front cover 933a configured to cover the edge portion of the display panel DP and the upper surface of the first support part 311a and may also include side covers 933b configured to cover the side surfaces of both the first support part 311a and the fixing part 311c. A hook 425 may be disposed in an inner side of the side cover 933b, and the hook 425 may be in contact with a lower surface of the fixing part 311c of the mold frame MF. The top chassis TC may be fixed to the mold frame MF by the hook 425. An opening may be defined in a part of any one of the side covers 933b. A first PCB 401 and a second PCB 402 may be exposed outwards from (exposed to the outside of) the top chassis TC through the opening.

The display panel DP may receive image data signals from a system and light from a backlight unit so as to display an image. As illustrated in FIG. 1, the display panel DP may be quadrangular in shape in a top plan view. With reference to the quadrangular shape, two sides that are relatively long in length (hereinafter referred to as "long sides") may be curved in a cross-sectional (thickness) view, whereas the other two sides that are relatively short in length (hereinafter referred to as "short sides") may be straight, e.g., not curved, in the cross-sectional (thickness) view. In an alternative exemplary embodiment, the long sides may be straight and the short sides may be curved.

The display panel DP illustrated in FIG. 1 will be fully described below with reference to FIGS. 3 and 4.

Figure 3:
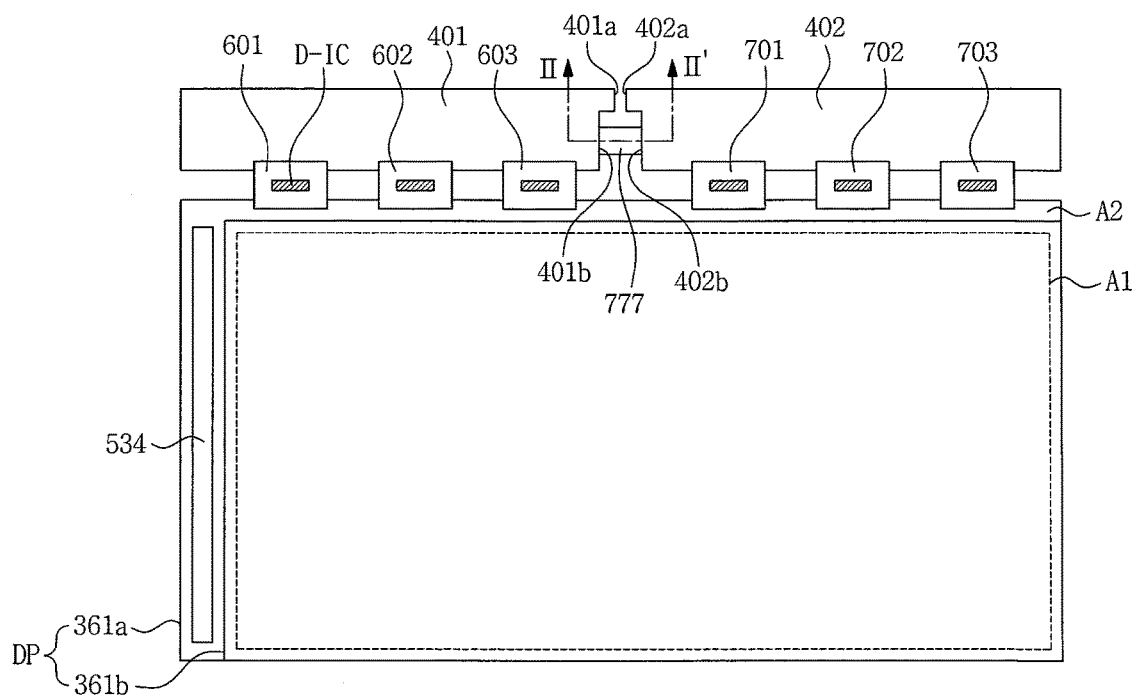
FIG. 3 is a detailed configuration diagram of a display panel illustrated in FIG. 1.

FIG. 3 is a detailed configuration diagram of the display panel DP illustrated in FIG. 1. FIG. 4 is a diagram illustrating an array of pixels disposed in a display area shown in FIG. 3.

As illustrated in FIG. 3, the display panel DP may include a lower substrate 361a and an upper substrate 361b that oppose each other with a liquid crystal layer interposed therebetween.

The lower substrate 361a may be partitioned into two areas: a display area A1 and a non-display area A2 as shown in FIG. 3. As illustrated in FIG. 4, the display area A1 may include a plurality of gate lines, a plurality of data lines intersecting (or crossing) the plurality of gate lines, and a plurality of pixels connected to the plurality of gate lines and the plurality of data lines.

The upper substrate 361b may be disposed on the lower substrate 361a. The upper substrate 361b may be large enough to cover at least the entire display area A1 of the lower substrate 361a.

Each of the lower and upper substrates 361a and 361b may include a plurality of surfaces. For ease of description, the plurality of surfaces of the respective substrates 361a and 361b may be defined as the following terms. That is, surfaces that face each other with the liquid crystal layer interposed therebetween may be defined as front surfaces of the corresponding substrates and the other surfaces opposite the front surfaces may be defined as rear surfaces of the corresponding substrates.

Although not illustrated, a black matrix, a plurality of color filters, and a common electrode may be disposed on the front surface of the upper substrate 361b.

The black matrix may be disposed on all parts except for parts corresponding to pixel areas of the front surface.

The color filters may be disposed in the pixel areas. The color filters may be classified into a red color filter, a green color filter, and a blue color filter.

The pixels may be arranged in a matrix form in the display area A1. The pixels (R, G, and B) may be classified into three categories: a plurality of red pixels (R) disposed corresponding to the red color filter; a plurality of green pixels (G) disposed corresponding to the green color filter; and a plurality of blue pixels (B) disposed corresponding to the blue color filter. The red, green, and blue pixels (R, G, and B), which are adjacent to each other in a horizontal direction, may form a unit pixel that displays a combination of colors.

A number j (j being a natural number) of pixels (hereinafter referred to as "$n^{th}$ horizontal line pixels") disposed along an $n^{th}$ horizontal line, where n is a natural number in the range from 1 to i inclusive, may be connected to $1^{st}$ to $j^{th}$ data lines (DL1 to DLj), respectively. The $n^{th}$ horizontal line pixels may be connected in common to an $n^{th}$ gate line. Accordingly, the $n^{th}$ horizontal line pixels may receive in common an $n^{th}$ gate signal. That is, the j pixels disposed on the same horizontal line may be all supplied with the same gate signal, but pixels on different horizontal lines may be supplied with different gate signals. In an exemplary embodiment, red and green pixels R and G disposed on a first horizontal line HL1 may be all supplied with a first gate signal, whereas red and green pixels R and G disposed on a second horizontal line HL2 may be supplied with a second gate signal that has a different timing from the first gate signal.

Figure 4:
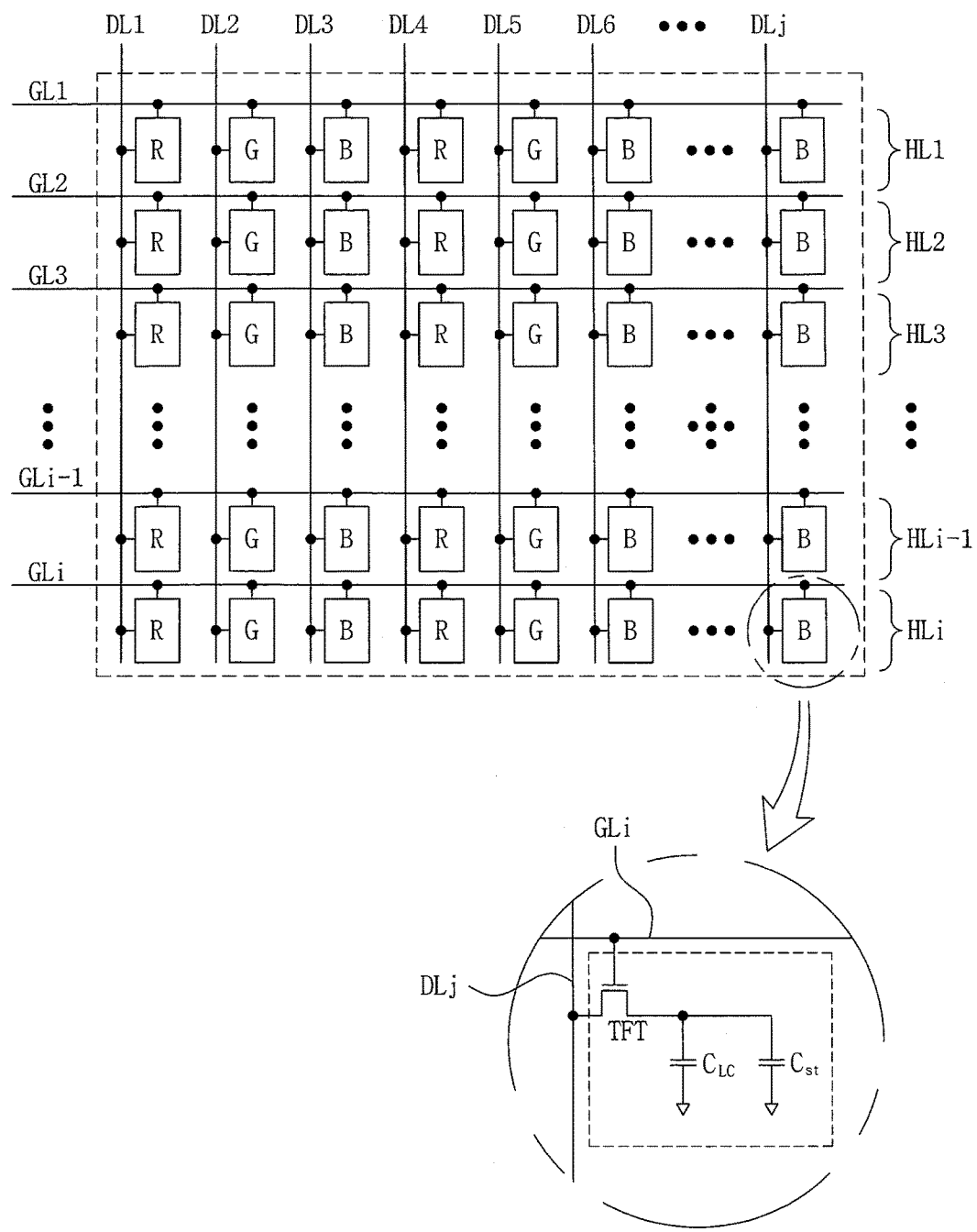
FIG. 4 is a diagram illustrating an array of pixels disposed in a display area shown in FIG. 3.

As illustrated in FIG. 4, each pixel may include a thin film transistor ("TFT"), a liquid crystal capacitor $C_{LC}$, and a storage capacitor $C_{st}$.

The TFT may be turned on in response to gate signals transmitted through gate lines. The TFT that is turned on may provide the liquid crystal capacitor $C_{LC}$ and the storage capacitor $C_{st}$ with analog image data signals transmitted through data lines.

The liquid crystal capacitor $C_{LC}$ may include a pixel electrode and a common electrode that oppose each other.

The storage capacitor $C_{st}$ may include a pixel electrode and a counter electrode (opposite electrode) that oppose each other. The counter electrode (opposite electrode) may be a previous gate line or a common line that transmits common voltage.

A gate driver 534 may be disposed in the non-display area A2. For example, as illustrated in FIG. 3, the gate driver 534 may be disposed adjacent to a left edge portion of the display area A1, in the non-display area A2.

The gate driver 534 may generate gate signals according to gate control signals supplied from a timing controller and may sequentially provide a plurality of gate lines with the gate signals. In an exemplary embodiment, the gate driver 534 may include a shift register that shifts a gate start pulse according to gate shift clocks and generates gate signals. The shift register may include a plurality of switching elements. The plurality of switching elements may be disposed on a front surface of the lower substrate 361a by the same process as a TFT of the display area A1.

Several data driver integrated circuits (D-IC) may receive digital image data signals and data control signals from the timing controller. The data driver integrated circuits (D-IC) may sample the digital image data signals according to the data control signals, and may then latch the sample image data signals falling into one horizontal line every horizontal time, and may supply the latched image data signals to the data lines DL1 to DLj. In other words, the data driver integrated circuits (D-IC) may convert the digital image data signals from the timing controller into analog image signals using a gamma voltage input from a power supply unit so as to supply the analog image signals to the data lines DL1 to DLj.

As illustrated in FIG. 3, the data driver integrated circuits (D-IC) may be mounted on the carrier tapes 601 to 603 and 701 to 703, respectively.

The carrier tapes may be in the form of a film.

The carrier tapes on which the data driver integrated circuits (D-IC) are mounted may also be called a tape carrier package.

The carrier tapes 601 to 603 and 701 to 703 may be divided into first carrier tapes 601 to 603 and second carrier tapes 701 to 703.

The first carrier tapes 601 to 603 may be configured to electrically connect the first PCB 401 to the display panel DP. To perform the function, in an exemplary embodiment, input terminals of the first carrier tapes 601 to 603 may be connected to first signal wire patterns on the first PCB 401, and output terminals of the first carrier tapes 601 to 603 may be connected to a first pad unit in the non-display area A2 of the display panel DP.

The first pad unit may be coupled to some of the data lines through first link lines.

One side of the first carrier tapes on which the input terminals are disposed may be bonded to the first PCB 401 by anisotropic conductive adhesive film. The opposite side of the first carrier tapes on which the output terminals are disposed may also be bonded to the display panel DP by anisotropic conductive adhesive film.

The second carrier tapes 701 to 703 may be configured to electrically connect the second PCB 402 to the display panel DP. To perform the function, in an exemplary embodiment, input terminals of the second carrier tapes 701 to 703 may be connected to second signal wire patterns on the second PCB 402, and output terminals of the second carrier tapes 701 to 703 may be connected to a second pad unit in the non-display area A2 of the display panel DP.

The second pad unit may be coupled to the other data lines through second link lines.

One side of the second carrier tapes on which the input terminals are disposed may be bonded to the second PCB 402 by anisotropic conductive adhesive film. The opposite side of the second carrier tapes on which the output terminals are disposed may also be bonded to the display panel DP by anisotropic conductive adhesive film.

The first and second carrier tapes 601 to 603 and 701 to 703 may include a flexible material that is bendable. In an exemplary embodiment, the first and second carrier tapes 601 to 603 and 701 to 703 may include polyimide having high coefficient of thermal expansion (CTE) or high durability. Besides polyimide, the first and second carrier tapes 601 to 603 and 701 to 703 may include synthetic resins, such as acrylic, polyether nitrile, polyethersulfone, polyethylene terephthalate, or polyethylene naphthalate.

The first and second pad units may be disposed adjacent to an upper edge portion of the display area A1, in the non-display area A2.

The output terminals of the first and second carrier tapes 601 to 603 and 701 to 703 may be disposed adjacent to an upper edge portion of the display area A1, in the non-display area A2.

Some of the first signal wire patterns may transmit the digital image data signals and data control signals from the timing controller to the data driver integrated circuits (D-IC; hereinafter "first data driver integrated circuits") mounted on the first carrier tapes 601 to 603. In this case, the first data driver integrated circuits may receive the digital image data signals and data control signals through input wire patterns on the first carrier tapes. The first data driver integrated circuits may output analog image data signals through output wire patterns on the first carrier tapes. In this case, an end portion of each input wire pattern may correspond to the input terminal, and an end portion of each output wire pattern may correspond to the output terminal.

The other first signal wire patterns may transmit the gate control signals to the gate driver 534 through auxiliary wire patterns on any one carrier tape and auxiliary lines on an edge portion (e.g., a corner) of the lower substrate 361a. The auxiliary wire patterns may be disposed on an outermost carrier tape of all of the carrier tapes 601 to 603 and 701 to 703. In an exemplary embodiment, as illustrated in FIG. 3, the auxiliary wire patterns may be disposed on one first carrier tape 601 that is on the leftmost side.

Some of the second signal wire patterns may transmit the digital image data signals and data control signals from the timing controller to the data driver integrated circuits (D-IC; hereinafter "second data driver integrated circuits") mounted on the second carrier tapes 701 to 703. In this case, the second data driver integrated circuits may receive the digital image data signals and data control signals through input wire patterns on the second carrier tapes. The second data driver integrated circuits may output analog image data signals through output wire patterns on the second carrier tapes. In this case, an end portion of each input wire pattern may correspond to the input terminal and an end portion of each output wire pattern may correspond to the output terminal.

The timing controller and power supply unit may be disposed on any one of the first and second PCBs 401 and 402.

The first and second PCBs 401 and 402 may be electrically connected to each other by a connection unit 777.

A flexible PCB may be used as the connection unit 777.

A plurality of connection wire patterns may be disposed on the connection unit 777.

When the timing controller is disposed on the second PCB 402, signals from the timing controller may be supplied to the first signal wire patterns of the first PCB 401 through the connection wire patterns of the connection unit 777. Meanwhile, when the timing controller is disposed on the first PCB 401, signals from the timing controller may be supplied to the second signal wire patterns of the second PCB 402 through the connection wire patterns of the connection unit 777.

At least a part of the first PCB 401 may protrude towards the second PCB 402. At least a part of the second PCB 402 may protrude towards the first PCB 401. In an exemplary embodiment, a part of each of surfaces of the first and second PCBs 401 and 402, which oppose each other, may protrude towards each other by a set or predetermined length. Each protruding part of the opposing surfaces may be defined as first and second protrusions 401a and 402a, and each non-protruding part of the opposing surfaces may be defined as first and second non-protrusions 401b and 402b.

When a distance between the first and second non-protrusions 401b and 402b is D and a length of the portion of the connection unit 777 extending between the first and second PCBs 401 and 402 is L, while the first and second protrusions 401a and 402a exactly meet, L may be larger than D. In other words, where the first protrusion 401a is in contact with the second protrusion 402a, the length of the connection unit 777 may be larger than the distance between the first and second non-protrusions 401b and 402b.

A portion of one or more layers of the connection unit 777 may be a part of one or more layers included in at least one of the first and second PCBs 401 and 402, an exemplary embodiment of which will be described below with reference to FIG. 5.

Figure 5:
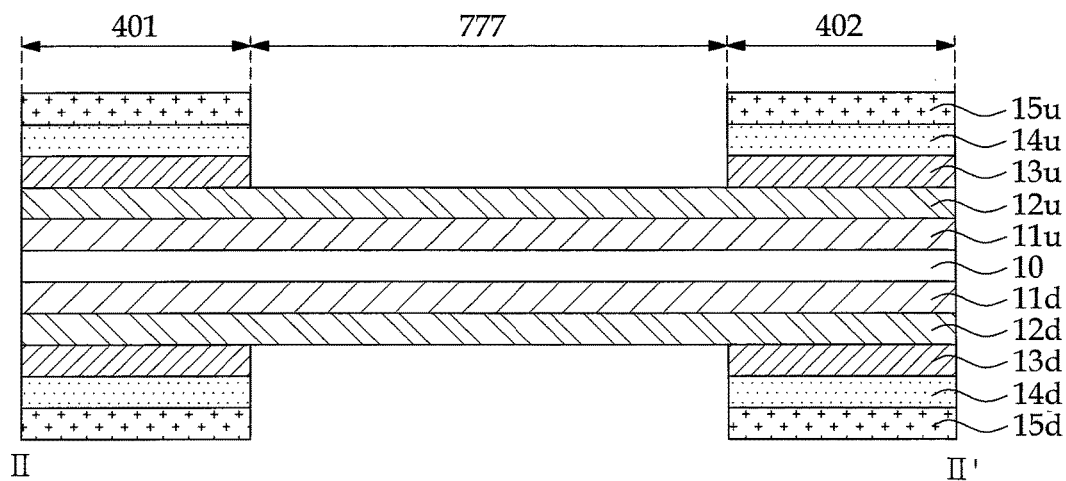
FIG. 5 is a cross-sectional view taken along line II-II' of FIG. 3.

FIG. 5 is a cross-sectional view taken along line II-II' of FIG. 3.

The first and second PCBs 401 and 402 may include a plurality of layers.

For example, the first PCB 401, as illustrated in FIG. 5, may include a polyimide layer 10, a first upper conductive layer 11u on the polyimide layer 10, an upper coverlay layer 12u on the first upper conductive layer 11u, an upper prepreg layer 13u on the upper coverlay layer 12u, a second upper conductive layer 14u on the upper prepreg layer 13u, a first resist layer 15u on the second upper conductive layer 14u, a first lower conductive layer 11d under the polyimide layer 10, a lower coverlay layer 12d under first lower conductive layer 11d, a lower prepreg layer 13d under the lower coverlay layer 12d, a second lower conductive layer 14d under the lower prepreg layer 13d, and a second resist layer 15d under the second lower conductive layer 14d. In one embodiment, the upper coverlay layer 12u, the first upper conductive layer 11u, the polyimide layer 10, the first lower conductive layer 11d, and the lower coverlay layer 12d are part of the connection unit 777. Parts of these layers, i.e., parts of the upper coverlay layer 12u, the first upper conductive layer 11u, the polyimide layer 10, the first lower conductive layer 11d, and the lower coverlay layer 12d that are sandwiched between the upper prepreg layer 13u and the lower prepreg layer 13d of the first PCB 401 are part of the connection unit 777 and also part of the first PCB 401. Similarly, parts of the upper coverlay layer 12u, the first upper conductive layer 11u, the polyimide layer 10, the first lower conductive layer 11d, and the lower coverlay layer 12d that are sandwiched between the upper prepreg layer 13u and the lower prepreg layer 13d of the second PCB 402 are part of the connection unit 777 and also part of the first PCB 401.

Circuit patterns patterned by exposure and etching may be disposed on the first upper conductive layer 11u. The first lower conductive layer 11d may have the same structure as the first upper conductive layer 11u.

The upper coverlay layer 12u may be an insulating layer and may protect a surface of the connection unit 777. The lower coverlay layer 12d may have the same structure as the upper coverlay layer 12u.

The upper prepreg layer 13u may impart hardness to the first and second PCBs 401 and 402. The lower prepreg layer 13d may have the same structure as the upper prepreg layer 13u.

Circuit patterns patterned by exposure and etching may be disposed on the second upper conductive layer 14u. The second lower conductive layer 14d may have the same structure as the second upper conductive layer 14u.

Contact holes may be defined in the first and second PCBs 401 and 402 therethrough. The second upper conductive layer 14u on the first PCB 401 may be coupled to the first upper conductive layer 11u on the connection unit 777 through the contact holes, or the second upper conductive layer 14u on the second PCB 402 may be coupled to the first upper conductive layer 11u on the connection unit 777 through the contact holes.

The first and second PCBs 401 and 402 may rotate around the first and second carrier tapes 601 to 603 and 701 to 703 that serve as an axis. When the first and second PCBs 401 and 402 rotate, the first and second carrier tapes 601 to 603 and 701 to 703 may be bent along a direction of the rotation.

When a display device is completed, the first and second PCBs 401 and 402 may rotate such as to be disposed on the rear of the bottom chassis BC.

Hereinafter, a method of manufacturing a display device according to an exemplary embodiment will be described in more detail.

The bottom chassis BC that is bent may be first prepared. The bottom chassis BC may be formed of a hard material such as a metal in a bent shape from the beginning. Therefore, the bottom chassis BC may maintain its bent shape without an external force.

Next, the reflector 900 may be formed on the base portion 111a of the bottom chassis BC. The reflector 900 may be formed of a flexible material that is bendable. Therefore, when the reflector 900 may be formed on the base portion 111a of the bottom chassis BC, the reflector 900 may also be bent like the bottom chassis BC.

Next, the light guide plate LGP in which the light source cover LC and the light source unit 801 are combined with each other may be formed on the reflector 900.

The light source cover LC may be formed of a hard material such as a metal in a bent shape from the beginning similar to the bottom chassis BC.

The light source cover LC may also be bent in the same shape as the bottom chassis BC. The light guide plate LGP may be formed of a flexible material. Accordingly, the light guide plate LGP may be bent in the same shape as the bottom chassis BC by the light source cover LC including a hard material.

Meanwhile, the PCB 801a in the light source unit 801 may be formed of a flexible material such as polyimide. Therefore, the PCB 801a may be coupled to the light source cover LC so as to be bent in the same shape as the bottom chassis BC.

Next, the optical sheet 201 may be formed on the light guide plate LGP. The optical sheet 201 may be formed of a flexible material. Accordingly, the optical sheet 201 may be bent in the same shape as the bottom chassis BC.

Next, the mold frame MF may be formed on the side portions 111b of the bottom chassis BC, and the display panel DP may be formed on the second support part 311b of the mold frame MF. The mold frame MF and the display panel DP may be formed of a flexible material such as plastic. In this case, the mold frame MF and the display panel DP may maintain bent shapes thereof because the top chassis TC is coupled to the bottom chassis BC, which will be described below. Meanwhile, the first and second PCBs 401 and 402 may be bonded to the display panel DP by the first and second carrier tapes 601 to 603 and 701 to 703.

Next, the first and second PCBs 401 and 402 may be separated from each other. This will be described below in more detail with reference to FIGS. 6A and 6B.

Figure 6A:
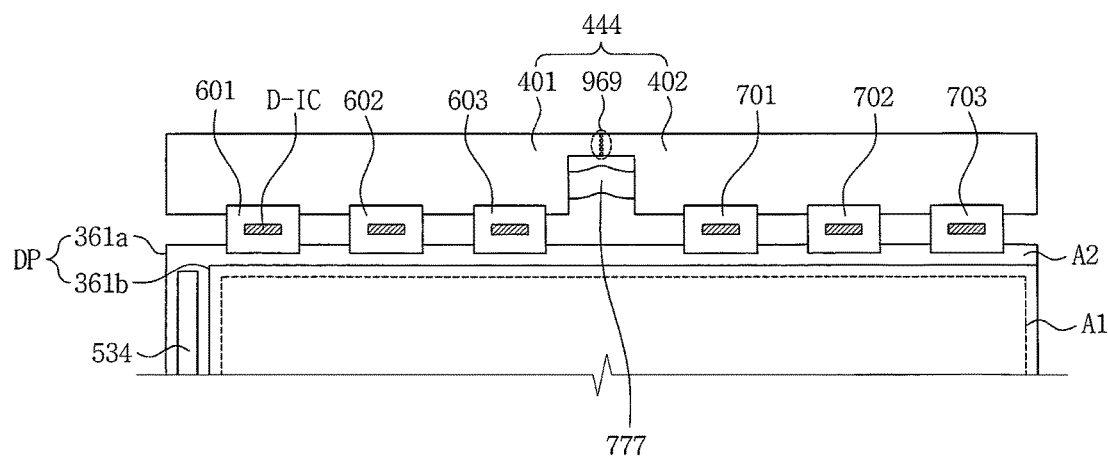
FIGS. 6A and 6B are diagrams illustrating a process of separating a first printed circuit board from a second printed circuit board.
Figure 6B:
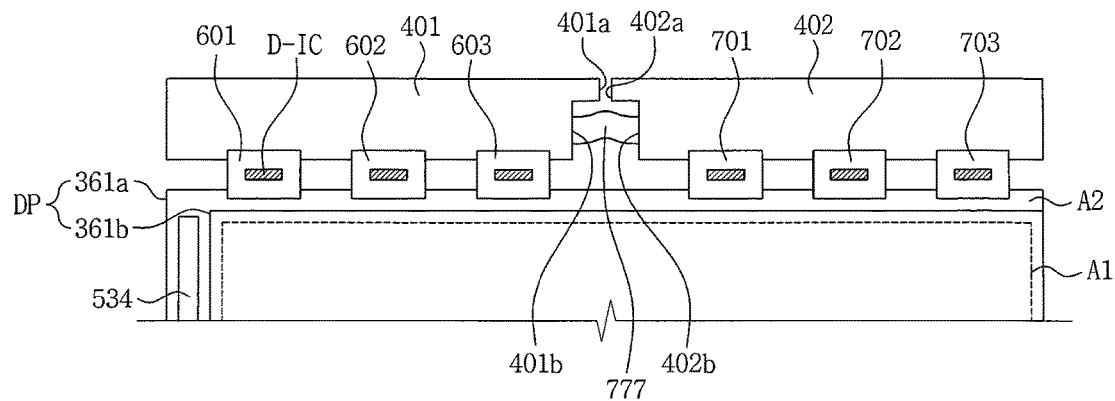
Figure 7:
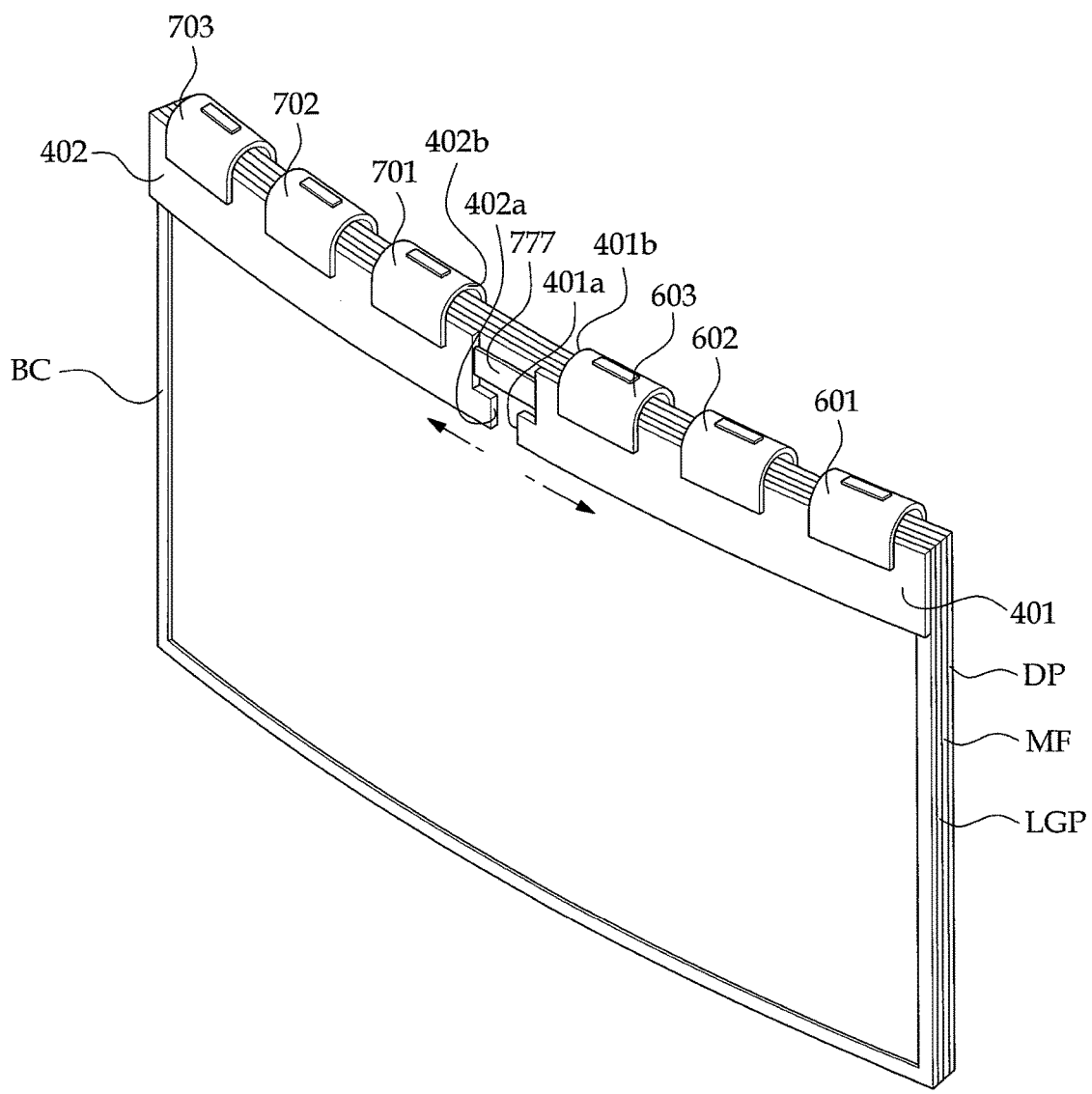
FIG. 7 is a diagram illustrating the rear of a bottom chassis.

FIGS. 6A and 6B are diagrams illustrating a process of separating the first PCB 401 from the second PCB 402. FIG. 7 is a diagram illustrating the rear of the bottom chassis BC.

As illustrated in FIG. 6A, the first and second PCBs 401 and 402 are one PCB 444 that is not separated at first, i.e., a part of the first printed circuit board is coupled to a part of the second printed circuit board. In this case, a cutting line 969 may be marked on a central portion of the non-separated PCB 444.

As illustrated in FIG. 6B, the central portion of the non-separated PCB 444 may be cut along the cutting line 969 by a laser cutting apparatus. Accordingly, the non-separated PCB 444 may be separated into two PCBs 401 and 402.

Next, as illustrated in FIG. 7, the first and second PCBs 401 and 402, which are separated from each other, may rotate towards the rear of the bottom chassis BC around the first and second carrier tapes 601 to 603 and 701 to 703 that serve as an axis. Accordingly, the first and second PCBs 401 and 402 may be disposed on the rear of the bottom chassis BC.

Next, the top chassis TC may be coupled to the bottom chassis BC while being disposed on the display panel DP. The top chassis TC may be formed of a hard material such as a metal in a bent shape from the beginning, which is similar to the bottom chassis BC. Therefore, the top chassis TC may maintain its bent shape without an external force. The top chassis TC may be coupled to the bottom chassis BC such that the display panel DP and the mold frame MF, which are disposed between the top chassis TC and the bottom chassis BC, may also be formed in a bent shape.

Consequently, the bottom chassis BC, the reflector 900, the light source unit 801, the light source cover LC, the light guide plate LGP, the optical sheet 201, the mold frame MF, the display panel DP, the first PCB 401, and the top chassis TC may all have bent shapes that are similar to each other, but may have different curvatures.

In other words, the first and second PCBs 401 and 402 may have the highest curvature (i.e., the largest radius of curvature) among the components included in the display device. This is because the first and second PCBs 401 and 402 are disposed on the lowermost side among the components. On the other hand, the top chassis TC disposed on the uppermost side may have the lowest curvature. The components between the first and second PCBs 401 and 402 and the top chassis TC may have curvature values between the highest curvature and the lowest curvature.

Meanwhile, the first and second PCBs 401 and 402 may have substantially the same curvature as the display panel DP before rotating towards the rear of the bottom chassis BC. However, where the first and second PCBs 401 and 402 rotate towards the rear of the bottom chassis BC, the curvature of the first and second PCBs 401 and 402 may increase. In this case, the first and second PCBs 401 and 402 may be affected by a force that separates the first and second PCBs 401 and 402 from each other due to the increased curvature. As illustrated in FIG. 7, the force may enable the first PCB 401 to move in the left arrow direction and the second PCB 402 to move in the right arrow direction. The first and second PCBs 401 and 402 may be separated from each other so that the connection unit 777 coupled therebetween may also move to the left and right sides, and thus a bent portion of the connection unit 777 may become straight. The connection unit 777 may allow the distance between the first and second PCBs 401 and 402 and the increased curvature thereof to remain unchanged.

As described above, although the curvature of the first and second PCBs 401 and 402 increases, the first and second PCBs 401 and 402 may move from side to side, and thus stress concentration on the first and second PCBs 401 and 402 may be reduced. Further, it is possible to reduce or effectively prevent deformation of the first and second carrier tapes 601 to 603 and 701 to 703 or damage thereto, thereby also reducing or minimizing damage to the wire patterns and data driver integrated circuits (D-IC) on the first and second carrier tapes 601 to 603 and 701 to 703.

According to one or more exemplary embodiment, the display panel DP may be a liquid crystal display panel, but the invention is not limited thereto. In addition to the liquid crystal display panel, any panel structure configured to display an image is available, such as an organic light emitting diode display panel.

From the foregoing, it will be appreciated that various exemplary embodiments of the invention have been described herein for purposes of illustration, and that various modifications may be made without departing from the scope and spirit of the disclosure. Accordingly, the various exemplary embodiments disclosed herein are not intended to limit the scope of the invention, and the true scope and spirit of the invention is indicated by the following claims, and equivalents thereof.

What is claimed is:

1. A display device comprising:
    a display panel having a curved shape and a plurality of sides;
    a first printed circuit board and a second printed circuit board, the first and second printed circuit boards extending in a first direction and having first and second protrusions facing each other, respectively, the first and second protrusions extending from respective first ends of the first and second printed circuit boards and being aligned with each other in the first direction;
    a first carrier tape configured to connect the first printed circuit board to a first side from among the sides of the display panel;
    a second carrier tape configured to connect the second printed circuit board to the first side from among the sides of the display panel; and
    a connection unit configured to connect the first and second printed circuit boards to each other, the connection unit comprising:
        a first part extending between the first ends of the first printed circuit board and the second printed circuit board in the first direction;
        a second part between layers of the first printed circuit board, the second part extending from the first part towards the first printed circuit board; and
        a third part between layers of the second printed circuit board, the third part extending from the first part towards the second printed circuit board,
    wherein at least one of the second part and the third part of the connection unit comprises a portion of a layer included in at least one of the first and second printed circuit boards, and
    wherein, when the first and second protrusions contact each other, a length of the first part of the connection unit is longer than a distance between non-protrusion portions of the first ends of the first and second printed circuit boards.

2. The display device of claim 1, wherein a length of the first part of the connection unit extending from the first printed circuit board to the second printed circuit board is longer than a distance between the first and second printed circuit boards.

3. The display device of claim 1, wherein at least one of the first and second printed circuit boards comprises:
    a polyimide layer;
    a first upper conductive layer on the polyimide layer;
    an upper coverlay layer on the first upper conductive layer;
    an upper prepreg layer on the upper coverlay layer;
    a second upper conductive layer on the upper prepreg layer;

a first resist layer on the second upper conductive layer;
a first lower conductive layer under the polyimide layer;
a lower coverlay layer under first lower conductive layer;
a lower prepreg layer under the lower coverlay layer;
a second lower conductive layer under the lower prepreg layer; and
a second resist layer under the second lower conductive layer.

4. The display device of claim 3, wherein the connection unit comprises the polyimide layer, the first upper conductive layer, the upper coverlay layer, the first lower conductive layer, the lower coverlay layer.

5. The display device of claim 1, further comprising:
a bottom chassis;
a light source unit configured to emit light;
a light guide plate configured to provide the display panel with light from the light source unit; and
a mold frame configured to support the display panel while being fixed to the bottom chassis.

6. The display device of claim 5, wherein the first and second printed circuit boards are disposed on a rear of the bottom chassis.

7. The display device of claim 1, wherein the first part is offset from the first and second protrusions in a second direction perpendicular to the first direction.

8. The display device of claim 1, wherein the first side of the display panel has the curved shape.

9. The display device of claim 1, wherein the first and second protrusions directly contact each other.

10. A display device comprising:
a display panel having a curved shape;
a first printed circuit board and a second printed circuit board, the first and second printed circuit boards having first and second protrusions facing each other, respectively;
at least one first carrier tape configured to connect the first printed circuit board to the display panel;
at least one second carrier tape configured to connect the second printed circuit board to the display panel; and
a connection unit configured to connect the first and second printed circuit boards to each other, the connection unit comprising:
a first part between the first printed circuit board and the second printed circuit board;
a second part between layers of the first printed circuit board, the second part extending from the first part towards the first printed circuit board; and
a third part between layers of the second printed circuit board, the third part extending from the first part towards the second printed circuit board,
wherein at least one of the second part and the third part of the connection unit comprises a portion of a layer included in at least one of the first and second printed circuit boards, and
wherein a length of the first part of the connection unit is longer than a distance between non-protrusions of the first and second printed circuit boards when the first protrusion is in direct contact with the second protrusion.

* * * * *